United States Patent
Wu

(10) Patent No.: US 6,756,936 B1
(45) Date of Patent: Jun. 29, 2004

(54) MICROWAVE PLANAR MOTION SENSOR

(75) Inventor: Xiaodong Wu, Roseville, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/367,101

(22) Filed: Feb. 13, 2003

Related U.S. Application Data

(60) Provisional application No. 60/445,976, filed on Feb. 5, 2003.

(51) Int. Cl.[7] .............................................. G01S 7/28
(52) U.S. Cl. .................................... 342/175; 342/28
(58) Field of Search ............................ 342/27, 28, 175; 343/700 MS

(56) References Cited

U.S. PATENT DOCUMENTS

| | | | |
|---|---|---|---|
| 4,445,097 A | 4/1984 | Godart et al. | 331/117 D |
| 4,630,003 A | 12/1986 | Torizuka et al. | 331/99 |
| 5,371,509 A | 12/1994 | Wallace, Jr. et al. | 343/741 |
| 5,583,523 A | 12/1996 | Wallace, Jr. | 343/741 |
| 6,008,750 A | 12/1999 | Cottle et al. | 342/42 |
| 6,064,276 A | 5/2000 | Hallatt et al. | 331/96 |
| 6,627,992 B2 * | 9/2003 | Ammar | 257/728 |
| 6,645,790 B2 * | 11/2003 | Moghe et al. | 438/107 |
| 2002/0006778 A1 * | 1/2002 | Sekine et al. | 455/318 |
| 2002/0110942 A1 * | 8/2002 | Moghe et al. | 438/26 |
| 2002/0115414 A1 * | 8/2002 | Sekine et al. | 455/73 |
| 2002/0171141 A1 * | 11/2002 | Ammar | 257/728 |

FOREIGN PATENT DOCUMENTS

| | | |
|---|---|---|
| GB | 2 243 495 | 1/1990 |
| GB | 2 253 108 | 11/1990 |

OTHER PUBLICATIONS

"SiGe MMICs and flip–chip MICs for low–cost microwave systems", Case, M.;Radio Frequency Integrated Circuits (RFIC) Symposium, 1997., IEEE , Jun. 8–11, 1997 pp.:117–120.*

"Compact single–chip W–band FMCW radar modules for commercial high–resolution sensor applications",Tessmann, Aet al.;Microwave Theory and Techniques, IEEE Trans. on, vol.: 50,Issue: 12, Dec. 2002 Ps:2995–3001.*

"Superconducting millimeter wave oscillators and SIS mixers integrated on a chip",Koshelets, V.P.; Shchukin, A.V.; Shitov, S.V Filippenko, L.V.;Applied Superconductivity, IEEE Transactions on , vol. 3 , Issue: 1 , Mar. 1993 pp.:2524–2527.*

"Integrated S band mixers", Genzabella, C.; Howell, C.;IRE International Convention Record , vol.: 14 , Mar. 1966 pp.:11–118.*

* cited by examiner

Primary Examiner—John B. Sotomayor
(74) Attorney, Agent, or Firm—John P. O'Banion

(57) ABSTRACT

A planar microstrip microwave transceiver employing a chip on board design where all components can be surface mounted. The transceiver employs a surface mounted FET chip in a low Q oscillator and a pair of surface mounted Schottky chips in balanced mixer, all of which are wire bonded to microstrip circuitry. This configuration, along with the circuit layout, provides a transceiver module for high frequencies such as 24 GHz that is small, low cost, lightweight and suitable for mass production

37 Claims, 13 Drawing Sheets

MICROWAVE PLANAR MOTION SENSOR

CROSS-REFERENCE TO RELATED APPLICATIONS

This application claims priority from U.S. provisional application serial No. 60/445,976 on Feb. 5, 2003, incorporated herein by reference.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to microwave transceivers used in motion detectors, such as Doppler shifted radar sensors used for detecting a moving target in the security industry, and more particularly to a planar transceiver which employs a chip on board design where all components can be surface mounted.

2. Description of Related Art

Microwave transceivers have been used in many applications, such as traffic surveillance radar systems, point-to-point communications systems, and intrusion detection systems. A microwave transceiver typically generates microwave radiation by means of a waveguide cavity oscillator or a transistor oscillator. The microwave radiation is then radiated into free space by means of a waveguide horn antenna or a microstrip patch antenna. A transistor oscillator using, for example, a field effect or a bipolar transistor, together with a dielectric resonator to stabilize its performance, is normally used for frequencies below approximately 14 GHz. Most commonly a packaged FET or Schottky device is used and soldered into the circuit. Examples of patents describing this type of configuration are U.S. Pat. Nos. 4,630,003, 4,445,097, 5,371,509, and 5,583, 523, each of which is incorporated herein by reference.

Various approaches have been taken in the construction of these lower frequency transceivers. For example, GB 2 253 108 A, incorporated herein by reference, shows a multilayer construction where the microwave components and the patch antennas are on separate circuit boards. The microwave circuit board has a component side and a ground plane side, and the antennas are coupled to the microwave circuitry by means of microstrips on the antenna board that are orthogonal to slots in the ground plane that are resonant at the oscillator frequency. This transceiver configuration also uses a dielectric resonator in the oscillator. Another example is U.S. Pat. No. 6,064,276, incorporated herein by reference, which uses a similar approach but has an extra Schottky device for frequency tuning of the oscillator. GB 2 243 495 A, incorporated herein by reference, describes a dielectric resonant oscillator of the type used in the foregoing two patents.

At higher microwave frequencies, such as 24 GHz and above, a beam-lead or Flip-chip Schottky diode is normally used in a microstrip mixer circuit. These diodes, however, are fragile and require a hard plate to support the microstrip substrate. Because of this requirement, high frequency microstrip circuits generally have only one substrate layer as, for example, shown in U.S. Pat. No. 5,832,376 incorporated herein by reference.

Waveguide cavity oscillators are preferred for use at these higher microwave frequencies because the performance of packaged transistors declines at higher frequencies. A Gunn diode (for the oscillator) and Schottky diode) for the mixer are commonly found in waveguide transceivers. Such waveguide transceivers typically include an oscillator, a circulator, a mixer, an antenna, and a waveguide to antenna transition. As shown in U.S. Pat. No. 6,008,750, incorporated herein by reference, a waveguide transceiver has been combined with a microstrip patch antenna to avoid this difficulty. However, because Gunn and Schottky diodes are used in the transceiver, it suffers from the disadvantage of requiring a relatively large amount of manual assembly, and the transceiver is bulky, heavy and costly. Also, the current consumption of a Gunn diode is typically six to eight times higher than that of a low phase noise GaAs MESFET oscillator, thus rendering a waveguide transceiver impractical as a wireless sensor.

Therefore, there is a need for a high frequency microwave transceiver for use as a wireless sensor that is small, lightweight, low cost and which addresses the foregoing and other deficiencies of waveguide transceivers.

BRIEF SUMMARY OF THE INVENTION

The present invention is directed to a novel transceiver design for use in motion sensors, which is of a smaller size, has a lower cost, and has lower current consumption and better performance than conventional transceivers. The invention is suitable for automatic assembly and can be used in wireless security applications.

By way of example, and not of limitation, the foregoing needs are met by a microwave transceiver design where, according to an aspect of the invention, the oscillator comprises a surface mounted FET chip and the mixer comprises a pair of surface mounted Schottky chips, all of which are wire bonded to microstrip circuitry. As a result, a 24 GHz transceiver module according to the invention is of a smaller size, lower cost, lighter weight and more suitable for mass production than conventional transceiver shown in FIG. 4. Beneficially, a microwave transceiver according to a further aspect of the invention is a substantially planar transceiver.

In one embodiment of the invention, the transceiver is a module that includes a soft multilayer printed circuit board made, for example, from a Teflon®-based material. A patch-type transmit antenna and a patch-type receive antenna are patterned on one side of the multilayer circuit board, while the other circuitry is located on the other side of the multilayer circuit board.

In one embodiment, a microwave circuit board comprising a microstrip oscillator circuit and a microstrip mixer circuit is superimposed over an antenna circuit board comprising a transmit antenna and a receive antenna with a ground plane layer in-between. Each antenna has a respective microstrip that is aligned with an associated microstrip on the microwave circuit board, and the ground plane layer has, for each antenna, a respective slot to provide coupling between the antenna microstrip and the associated microstrip on the microwave circuit board.

According to an aspect of the invention, the oscillator circuit uses a wire bonded surface mounted transistor chip and does not require a dielectric resonator. According to another aspect of the invention, the mixer circuit comprises a balanced mixer that uses a pair of wire bonded surface mounted diode chips. In one embodiment, the transistor chip comprises a field effect transistor. In another embodiment, the mixer diode chip comprises a Schottky diode.

In accordance with another aspect of the invention, the transceiver assembly is disposed within the cavity of a housing in which the transceiver assembly is hermetically sealed.

In one embodiment, the output signal from the local oscillator is coupled through a direct current (DC) block to the input of a power divider. A portion of the local oscillator signal is coupled to the transmit antenna through a first output of the power divider which is coupled to the transmit antenna through a slot in the ground plane. A portion of the local oscillator signal is also coupled to the first input of the mixer through a second output of the power divider. The mixer has a second input for receiving the reflected target signal from the receive antenna through a slot in the ground plane. The mixer combines the local oscillator signal and the target signal to produce a Doppler signal for further signal processing.

In one embodiment, the transceiver assembly comprises an antenna card and a circuit card. The thickness of the microstrip substrate for the antenna card is approximately 20 mil and the thickness of the microstrip substrate for the circuit card is approximately 10 mil. The two cards (substrates) are bonded together by a bonding film and share a common ground (copper layer). The FET chip and the Schottky chip, which are approximately 15 mil×15 mil each, are wire bonded directly to microstrips on the circuit card.

Beneficially, according to an aspect of the invention, a balanced mixer comprising two Schottky chips is used and the transmitting and receiving channels are separated by using two antennas. As result, the performance characteristics such as sensitivity and detection pattern are superior to conventional waveguide transceivers.

A still further aspect of the invention is to surface mount all of the components in the transceiver assembly to render the invention suitable for automatic production and overcome the need for manual assembly.

Beneficially, a transceiver assembly according to the present invention does not require a buffer between the oscillator and the mixer. Furthermore, frequency tuning is accomplished by direct perturbation of a stub on the oscillator circuit.

According to another aspect of the invention, the FET and Schottky chips are directly wire bonded to microstrips on the surface of the multilayer soft substrates. Beneficially, this overcomes the limitation of using transistors at above 20 GHz and difficulties associated with using thin, flexible multilayer substrates at high microwave frequencies.

In accordance with an embodiment of the invention, low cost standard waveguide type Schottky chips are used instead of a surface-mount device such as a lead-beam diode which requires a hard plate for support. Lead-beam diodes are easily broken on flexible transceiver cards.

Advantageously, a transceiver according to the present invention does not require a dielectric resonator to stabilize its oscillation. Dielectric resonators require manual placement which increases the difficulty of production. Optionally, however, a dielectric resonator can be incorporated into the assembly to increase performance at a cost tradeoff.

In accordance with a still further aspect of the invention, the transceiver can operate at different frequencies, such as in the range from 16 GHz to 90 GHz by changing the size of the patch antenna and microstrip circuits and the thickness of the substrate.

In another embodiment of the invention, a modulator is optionally included in the transceiver so that the transceiver can be used for short-range communications.

As can be seen, a microwave transceiver assembly according to the invention is simple, inexpensive, lightweight and compact, thus making it suitable for commercial production and applications. The transceiver employs an all-chip-on-board design which allows for automatic production.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

The present invention departs from conventional microwave transceivers in several respects as will be more fully seen below. Notably, the present invention comprises a high frequency planar microwave transceiver design that employs a flexible a multilayer circuit board. As used herein, the term "high frequency" means a range from approximately 16 GHz to approximately 90 GHz. The oscillator in the present invention is a low Q oscillator as compared to high Q oscillators in conventional transceivers, and does not require use of a dielectric resonator, although one could optionally be used. Furthermore, instead of using soldered packaged devices for the oscillator and mixer that would break when used with flexible circuit boards, the present invention uses a wire bonded transistor chip for the oscillator and a pair of wire bonded diode chips for the balanced mixer. These characteristics, as well as the circuit layout and the use of a DC block incorporated into the circuit instead of using a chip capacitor for the DC block, enables operation at high frequencies.

Figure 1:
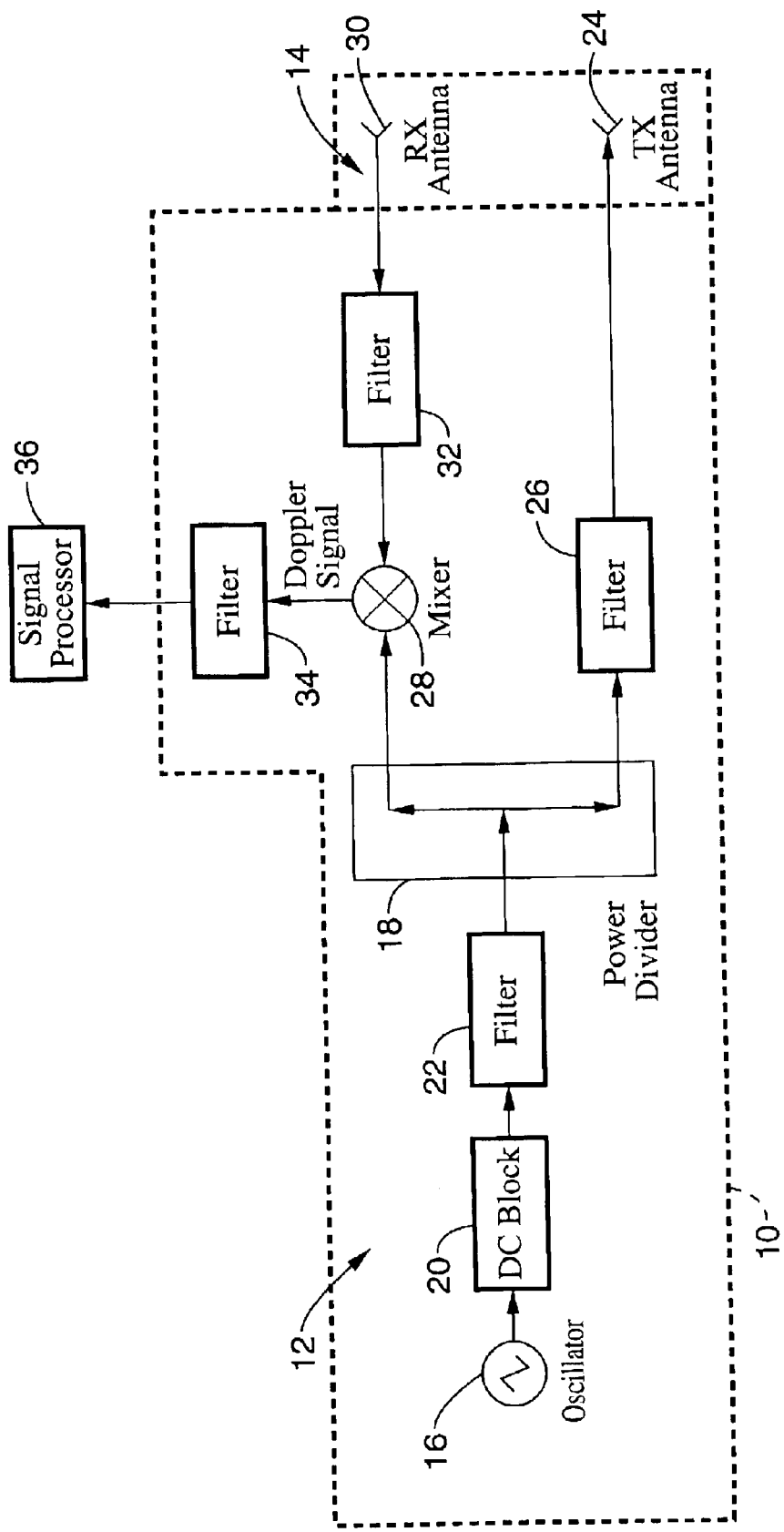
FIG. 1 is functional block diagram of a microwave transceiver according to an embodiment of the invention.

Referring to FIG. 1, a functional block diagram of an embodiment of a microwave transceiver according to the present invention is shown and designated as 10 in the figure. In the embodiment shown, the transceiver has an oscillator/mixer section 12 and an antenna section 14. The output signal from a local oscillator 16 is coupled to the input of a power divider 18 through a direct current (DC) block 20 and a harmonic filter 22. A portion of the local oscillator signal from a first output of power divider 18 is coupled to a transmit antenna 24 through a harmonic filter 26. A portion of the local oscillator signal is also coupled from a second output of power divider 18 to a first input of a balanced mixer 28. The reflected target signal from receive antenna 30 is coupled to a second input of mixer 28 through a harmonic filter 32. The mixer combines the local oscillator signal and the target signal to produce a Doppler signal. The Doppler signal is then filtered by filters 34 (e.g., 24 GHz/48 GHz for a 24 GHz transceiver) to produce a final output signal for processing by a signal processor 36 or the like.

Figure 2:
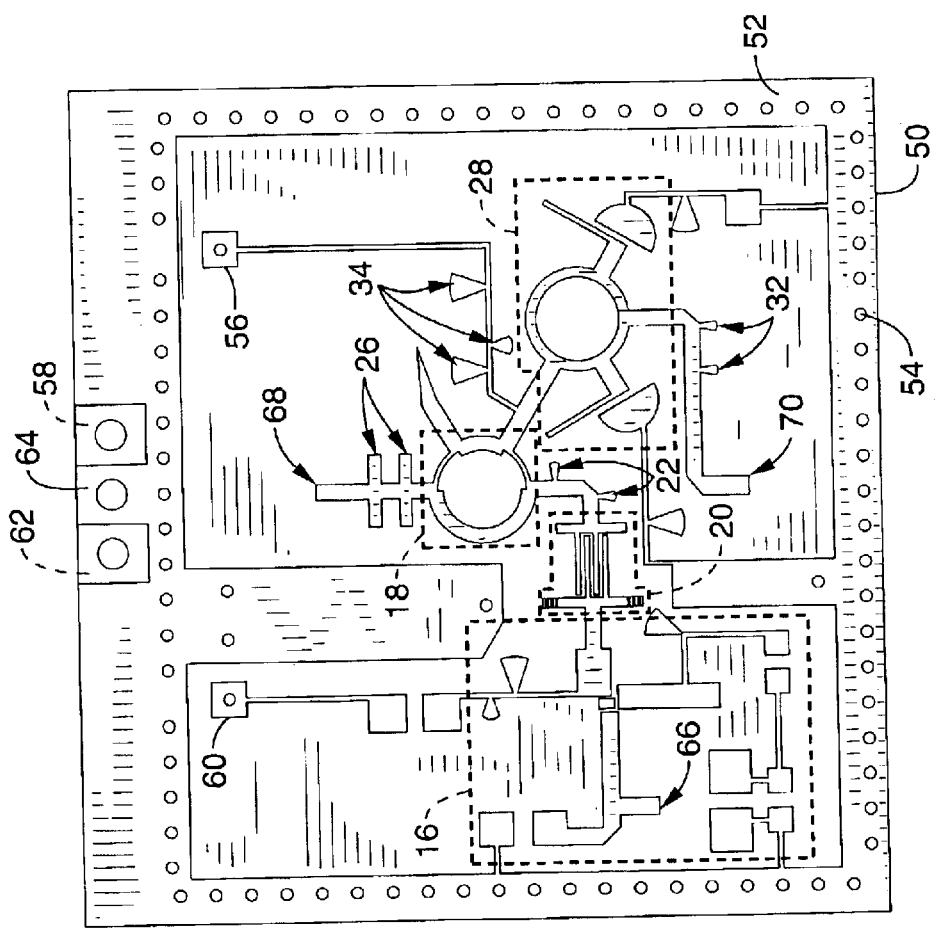
FIG. 2 is a microstrip circuit layout, viewed from the patterned side, of an embodiment of an oscillator/mixer card corresponding to the transceiver configuration of FIG. 1.

Performance of the circuit is sensitive to the type of components used, the surface mount construction techniques used, and the circuit layout. As indicated previously, performance at high frequencies is enabled by the use of surface mounted chip devices in the oscillator and mixer. FIG. 2 shows the inventive microstrip layout of oscillator/mixer section 12 of the transceiver as viewed from the component side of an oscillator/mixer card 50 that supports the circuitry. All of the microstrips can be seen in relation to each other, and in relation to the transmission lines, filters and other components that are formed thereby. Note that DC block 20 is configured from microstrips rather than consisting of a discrete capacitor as in conventional transceivers.

The ground pattern 52 and associated vias 54 for bonding to the ground plane on the back side of oscillator/mixer card 50 can also be seen in FIG. 2. The ground plane is patterned on the back side to provide a connection path between the Doppler output 56 and corresponding terminal 58, as well as between the DC bias/pulse input 60 and corresponding terminal 62. Terminal 64 is the ground connection. By placing the bias circuits in the middle layer of the multilayer board the unit can be sealed to protect the wire bonded components. Also shown are a tuner microstrip 66 for frequency adjustment of approximately ±250 MHz, an antenna output microstrip 68 for coupling to transmit antenna 24, and an antenna input microstrip 70 for coupling to receive antenna 30. The manner in which the oscillator is tuned and the manner of antenna coupling will be described below.

Figure 3:
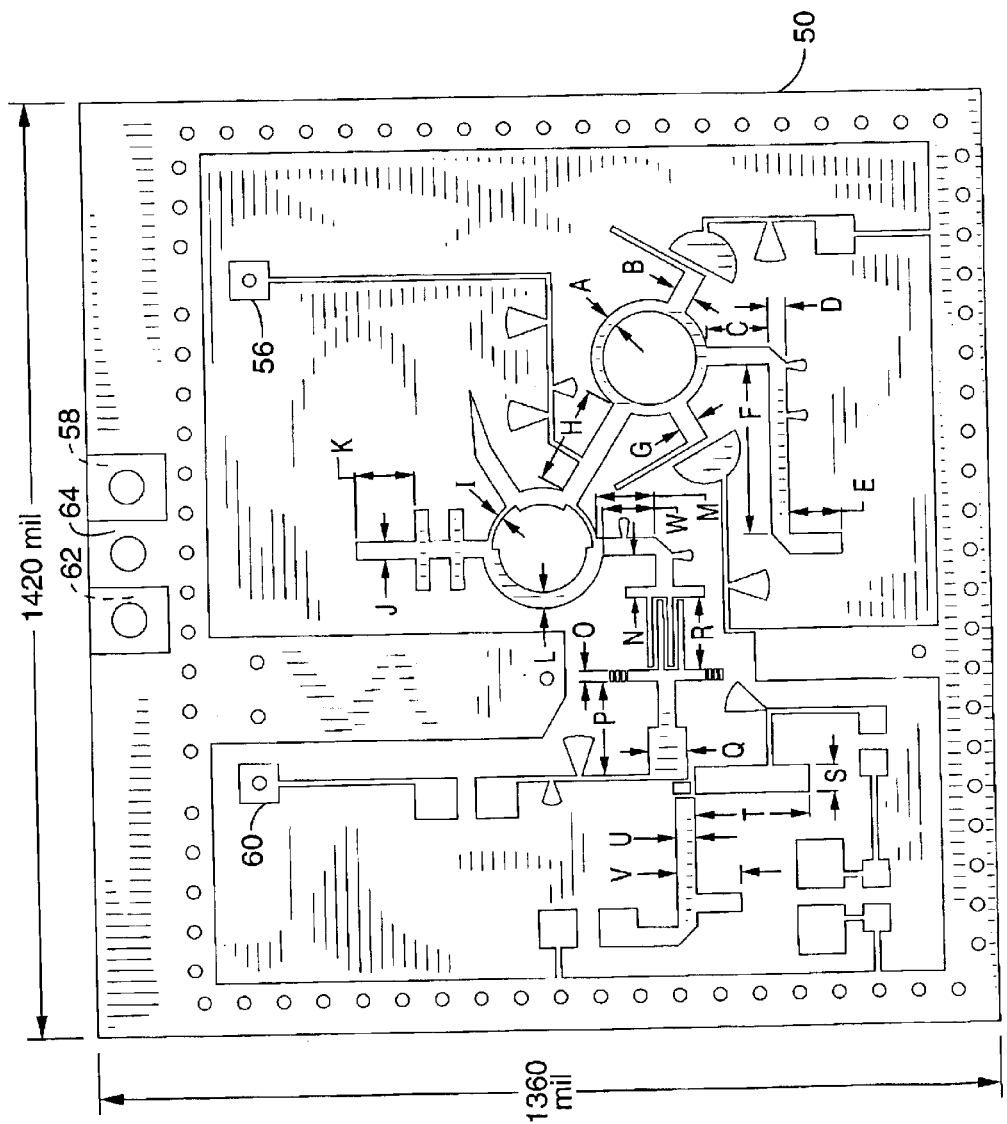
FIG. 3 is a dimensional layout, viewed from the patterned side, of the oscillator/mixer card of FIG. 2.

FIG. 3 shows the dimensions of the microstrips for a 24 GHz embodiment of the transceiver. The microstrips are formed from copper having a thickness of approximately 0.7 mils. As can be seen, oscillator/mixer card 50 is a small rectangular board which is approximately 1360 mils×1420 mils and approximately 10 mils thick. The dimensional parameters for the microstrips identified in FIG. 3 are given in Table 1.

TABLE 1

| Microstrip Identification | Dimension (mils) |
|---|---|
| A | 15.6 |
| B | 28 |
| C | 90 |
| D | 28 |
| E | 78 |
| F | 259 |
| G | 28 |
| H | 155 |
| I | 6 |
| J | 28 |
| K | 90 |
| L | 23.4 |
| M | 86.5 |
| N | 48 |
| O | 16 |
| P | 143 |
| Q | 58 |
| R | 111 |
| S | 40 |
| T | 172 |
| U | 28 |
| V | 95 |
| W | 77.8 |

Except as described herein, the details of the fabrication of the circuits at high frequencies are not provided since they are well known in the art to any microwave design engineer. The circuit layout, however, as well as the dimensions above, are inventive.

Figure 4:
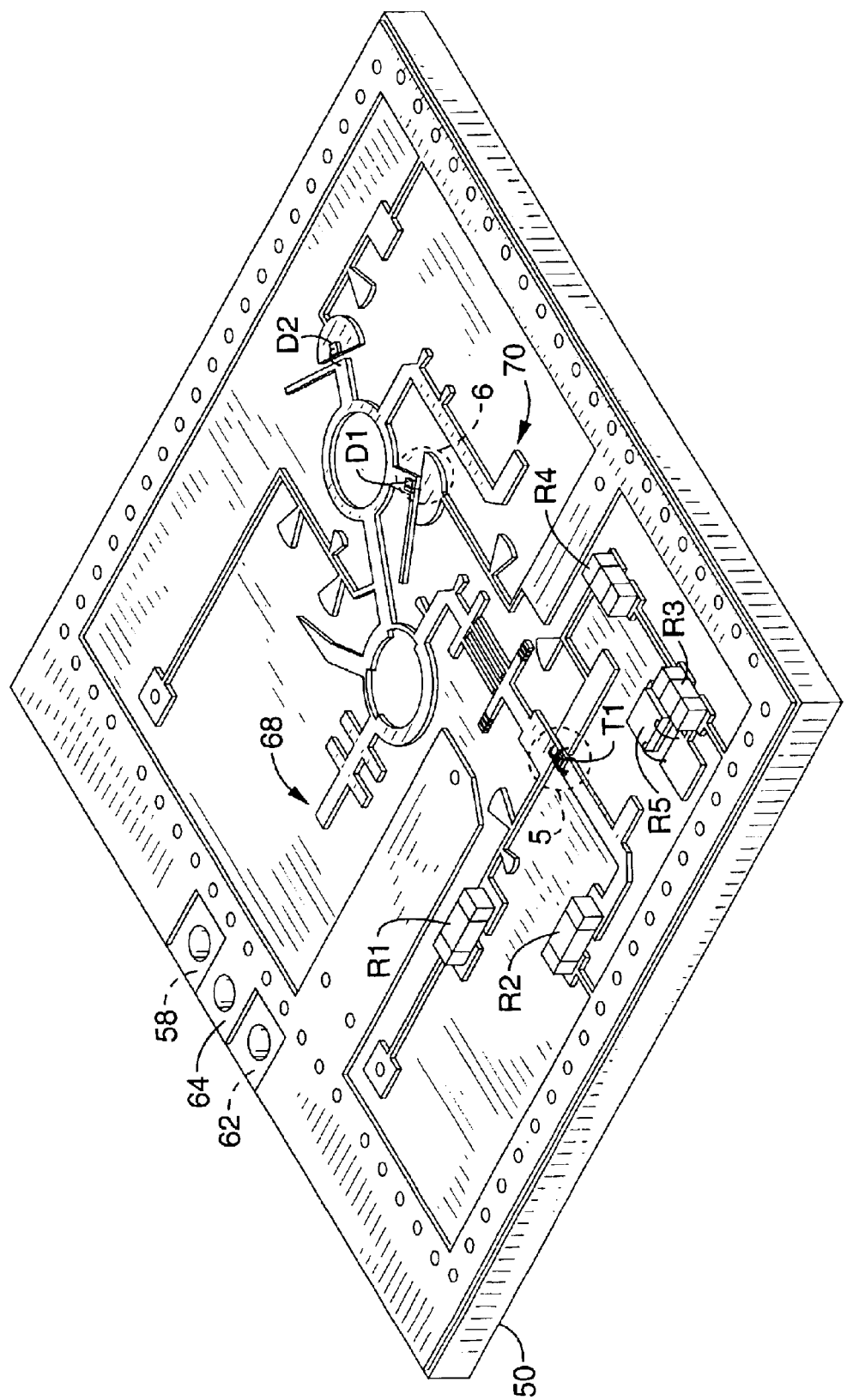
FIG. 4 is a perspective view of the oscillator/mixer card of FIG. 2 and FIG. 3 showing placement of discrete components in the circuit.
Figure 5:
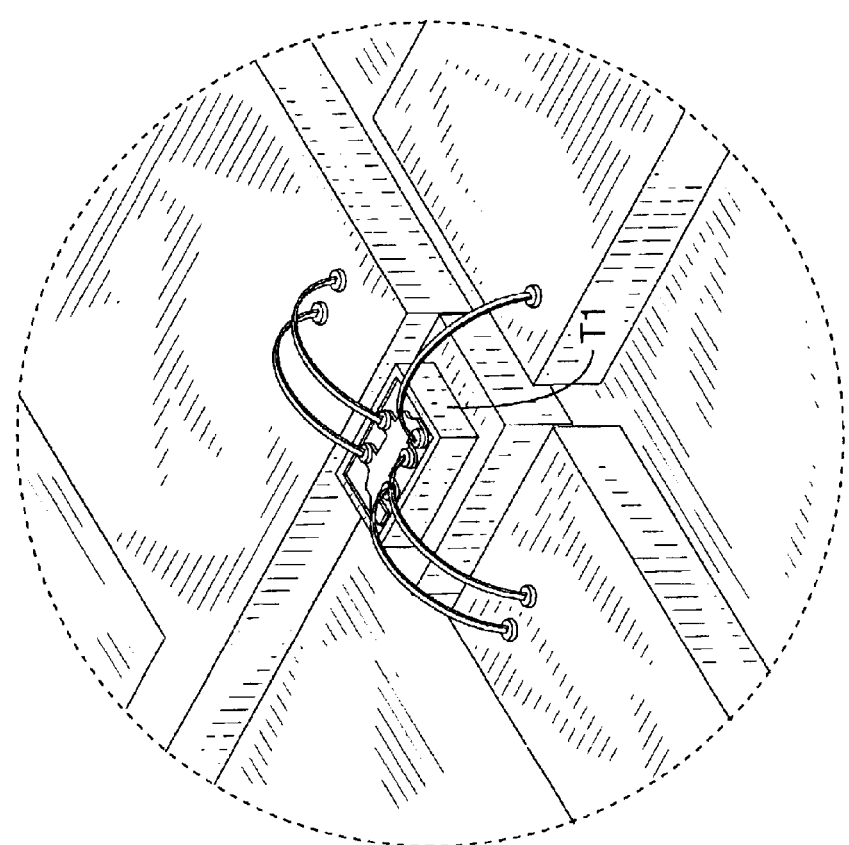
FIG. 5 is a detail view of a surface mounted FET chip wire bonded in the oscillator circuit of FIG. 4.

Referring now to FIG. 4, the transceiver uses few discrete components. Those that are used are small surface mounted devices as illustrated. The part values for a 24 GHz embodiment of the transceiver are shown in Table 2.

TABLE 2

| Component | Value |
|---|---|
| R1 | 47 Ω |
| R2 | 47 Ω |
| R3 | 75 Ω |
| R4 | 20 Ω |
| R5 | 50 Ω |

R1 through R4 are chip resistors. R5 is a temperature compensation resistor. T1 is a surface mounted microwave FET chip such as a type MWT-LP7 available from Microwave Technology, Inc. Other active devices could be HBT's, PHEMT's and HEMT's for example. D1 and D2 are surface mounted Schottky chips such as a type HVMSK-1 or TOMSK-1 available from Metelics. As can be seen in FIG.

Figure 6:
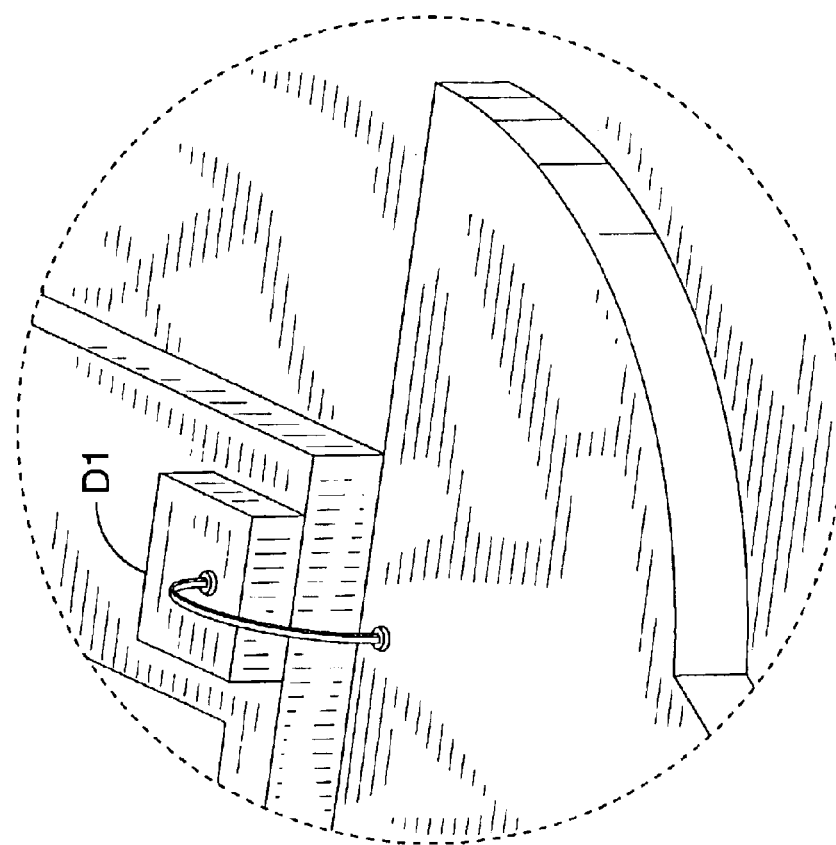
FIG. 6 is a detail view of a surface mounted Schottky diode chip wire bonded in the mixer circuit of FIG. 4.

5 and FIG. 6, these chip devices are wire bonded to the microstrips instead of soldered as in conventional circuits.

Figure 7:
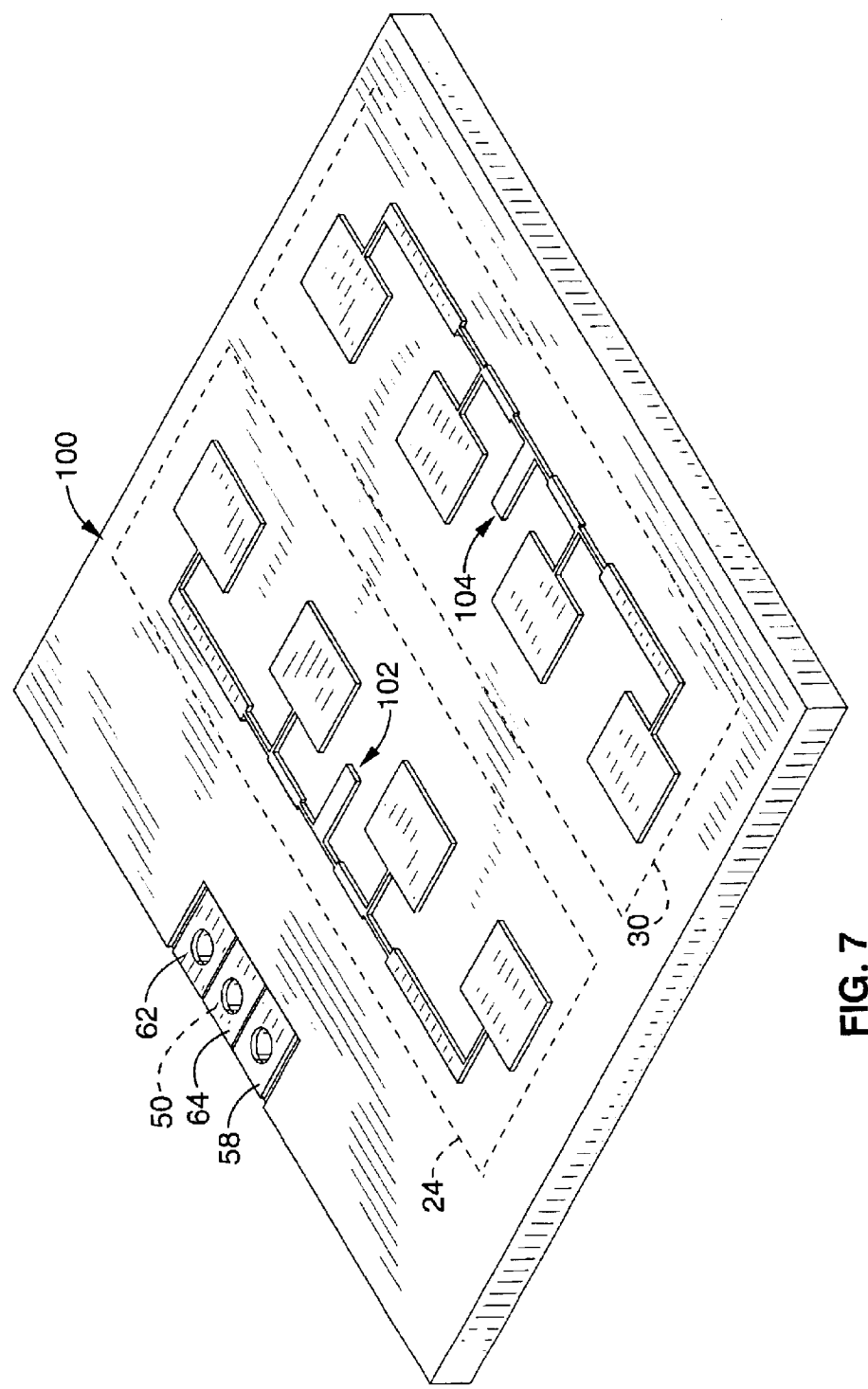
FIG. 7 is a perspective view of the patterned side of an embodiment of a patch antenna card corresponding to the transceiver configuration of FIG. 1.

In the preferred embodiment, the transceiver is constructed in layers from two cards; oscillator/mixer card 50 as described above, and an antenna card 100 as shown in FIG. 7. Note that the size of antenna card 100 generally matches that of oscillator/mixer card 50 so that they two cards can be overlayed and bonded as an integral structure. Antenna card 100 is approximately 20 mils thick and is patterned with copper approximately 0.7 mils thick to form a patch array comprising transmit antenna 24 and receive antenna 30. Transmit antenna 24 and receive antenna 30 each have coupling microstrips 102, 104, respectively, which couple the antennas to the corresponding microstrips 68, 70, respectively, on oscillator/mixer card 50.

At other frequencies, the thicknesses of oscillator/mixer card 50 and antenna card 100 would be different. Table 3 shows the thicknesses for these cards for select design frequencies.

TABLE 3

| Frequency GHz | Oscillator/Mixer Card Thickness (mils) | Antenna Card Thickness (mils) |
| --- | --- | --- |
| 24 | 10 | 20 |
| 35 | 10 | 10 |
| 76 | 5 | 5 |
| 90 | 5 | 5 |

Figure 8:
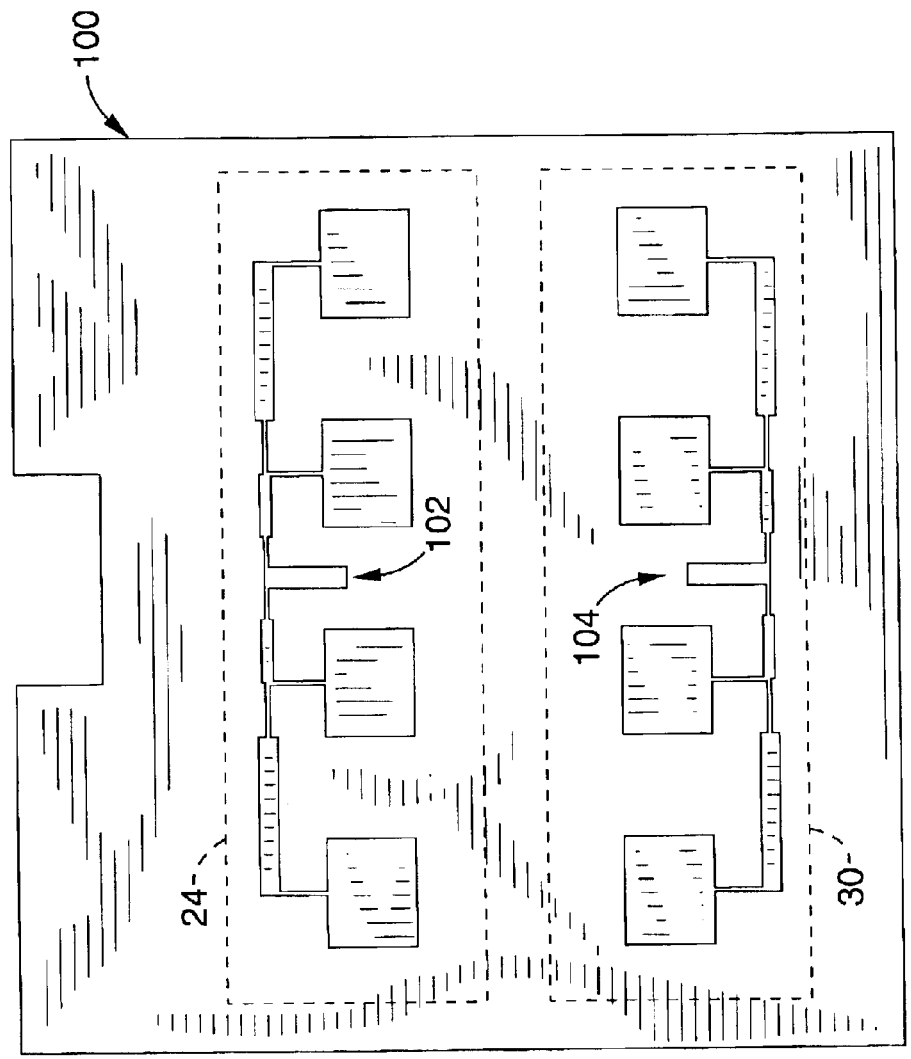
FIG. 8 is a plan view of the antenna card of FIG. 7.
Figure 9:
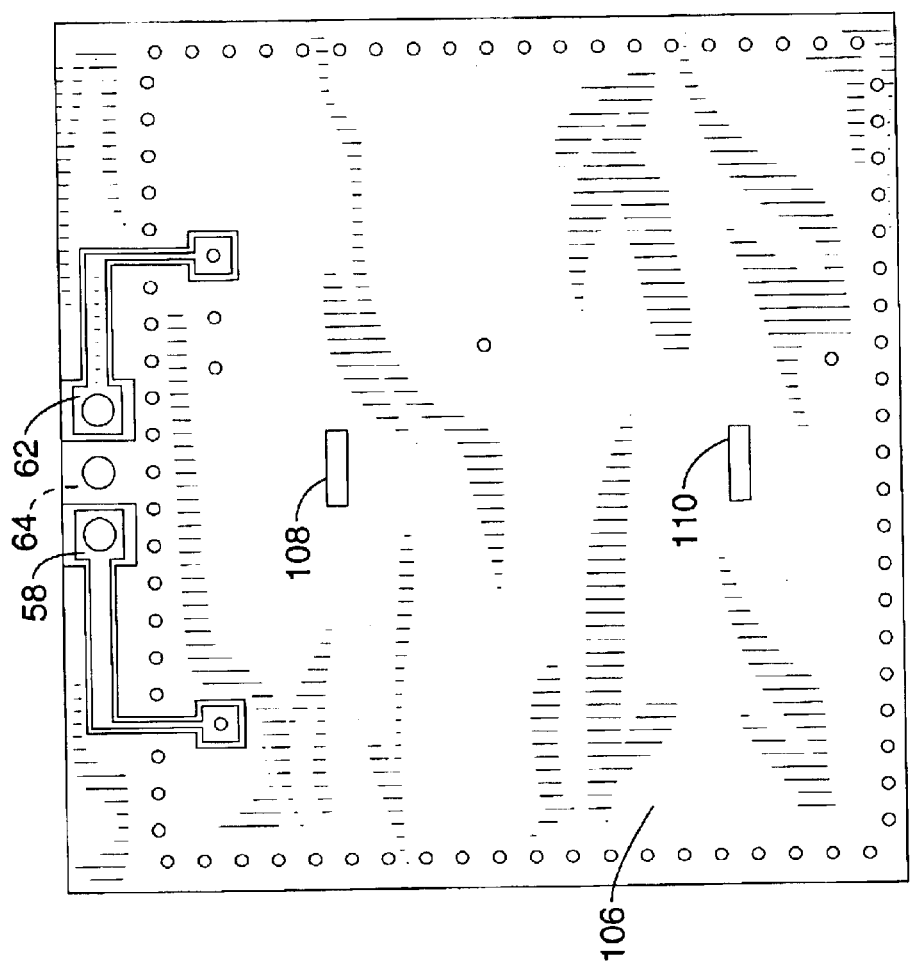
FIG. 9 is a plan view of the ground plane side of the oscillator/mixer card of FIG. 2 and FIG. 3.
Figure 10:
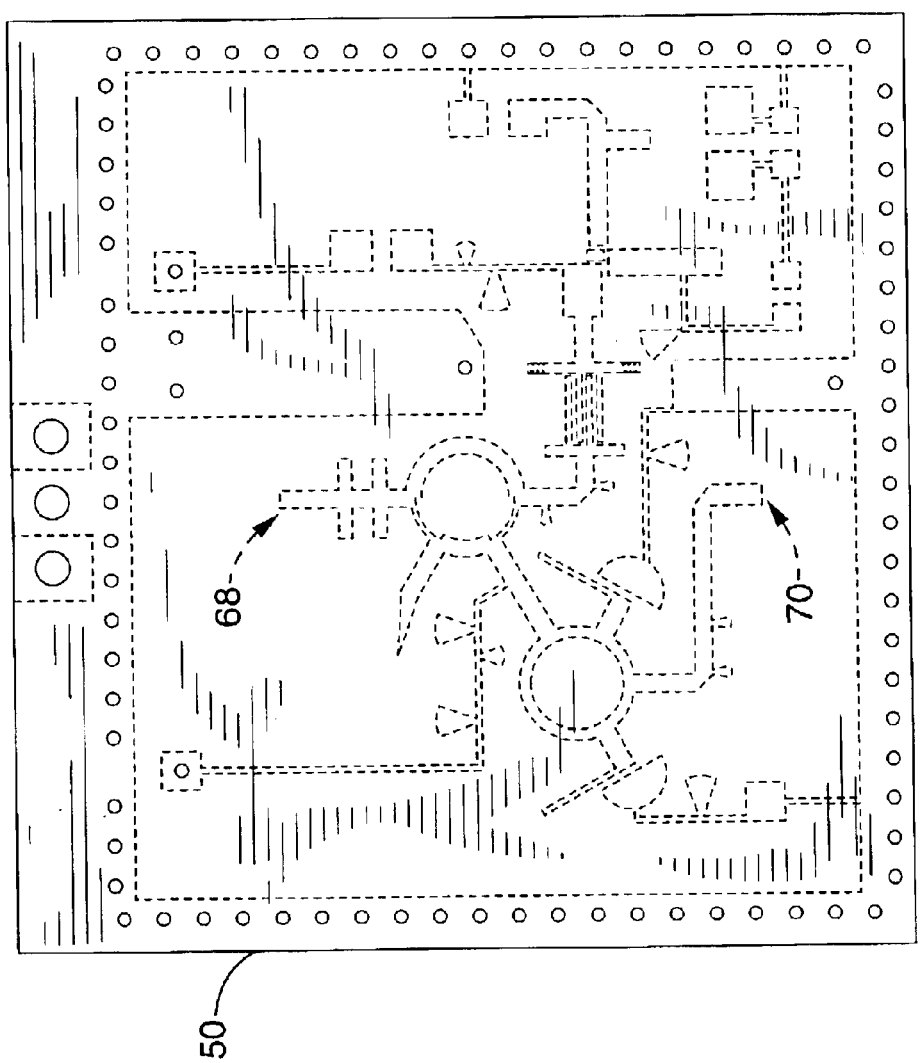
FIG. 10 is a plan view of the backside of the oscillator/mixer card of FIG. 2 and FIG. 3 with the ground plane removed and with the circuitry on the opposite side of the card shown in hidden lines.
Figure 11:
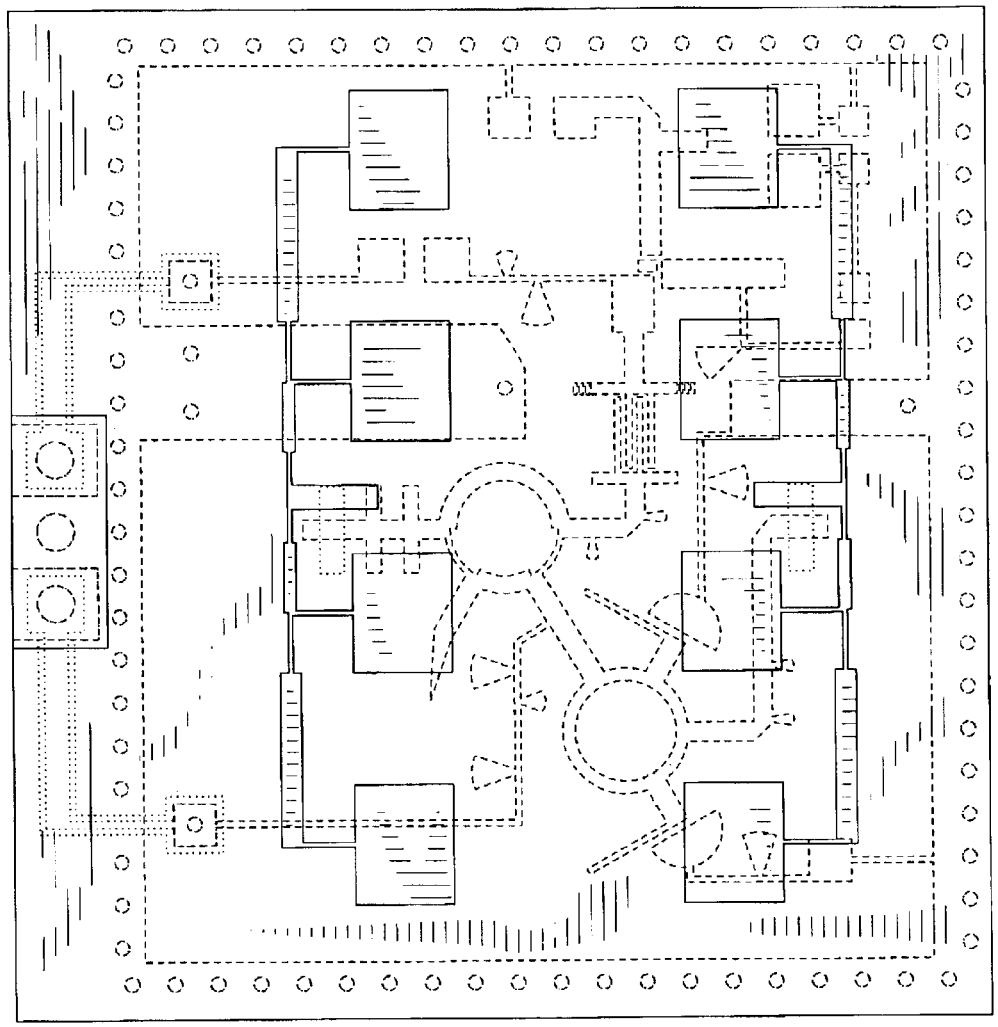
FIG. 11 is a plan view of the antenna card of FIG. 8 superimposed over the backside of the oscillator mixer card of FIG. 10, as seen from the patterned side of the antenna card.

FIG. 8 through FIG. 11 show the multilayer configuration established by oscillator/mixer card 50 and antenna card 100. FIG. 8 shows the patterned side of antenna card 100. FIG. 9 shows the ground plane 106 on the backside of oscillator/mixer card 50. FIG. 10 shows the patterned side of oscillator/mixer card 50 viewed in hidden lines from the ground plane side of the card. FIG. 11 shows the multilayer assembly 120 with antenna card 100 superimposed over, and adjacent to, the ground plane side of oscillator/mixer card 50. The ground plane shown in FIG. 9 has a pair of slots (cutouts) 108, 110 through which the antennas and circuitry are coupled at the resonant frequency with little insertion loss. Slot 108 is orthogonal to microstrip 102 on transmit antenna 24 and microstrip 68 on the output of power divider 18. Slot 110 is orthogonal to microstrip 104 on receive antenna 30 and microstrip 70 on the input of mixer 28.

Oscillator/mixer card 50 and antenna card 100 are fabricated from a soft substrate material such as a Teflon®-based material. The two cards (substrates) are bonded together by a bonding film and share a common ground (copper layer 106). The resultant construct comprises antenna card 100 superimposed over oscillator/mixer card 50 a ground plane layer 106 in-between. Each antenna has a respective microstrip that substantially overlies an associated microstrip on the microwave circuit board, and the ground plane layer has, for each antenna, a respective slot to provide coupling between the antenna microstrip and the associated microstrip on the oscillator/mixer card.

Figure 12:
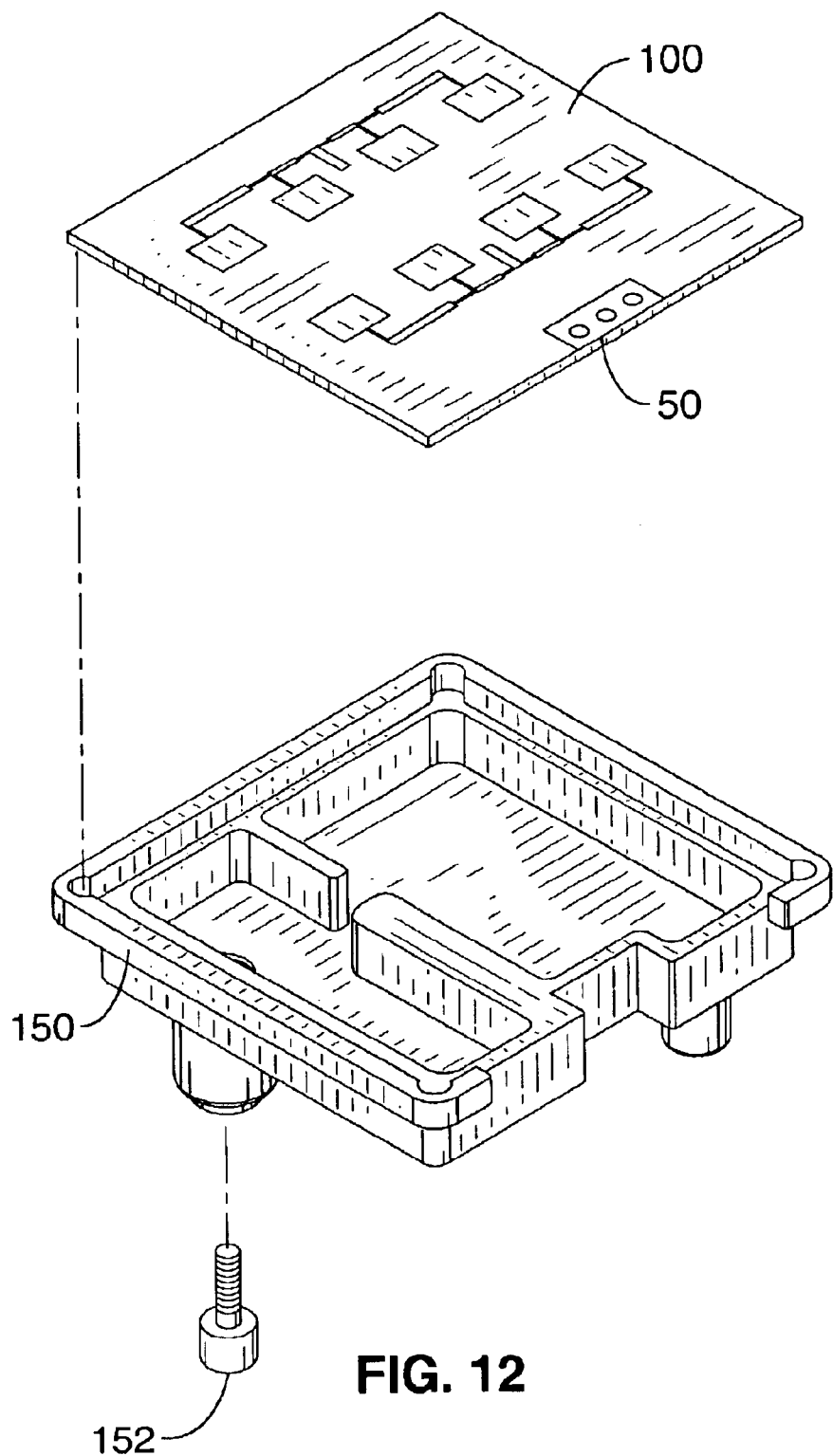
FIG. 12 is an exploded view of the transceiver card assembly of FIG. 11 and a housing for the assembly.
Figure 13:
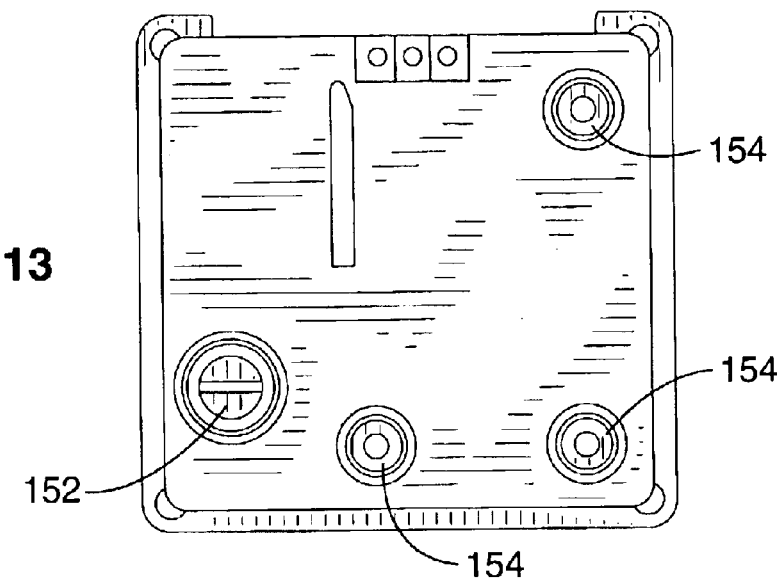
FIG. 13 is bottom plan view of the housing portion of the assembly shown in FIG. 12.
Figure 14:
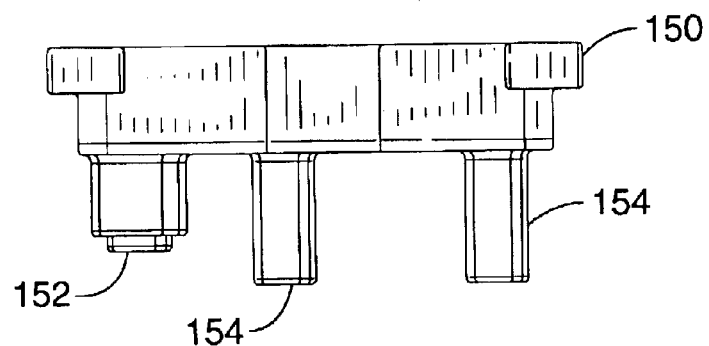
FIG. 14 is a side view of the housing portion of the assembly shown in FIG. 12.
Figure 15:
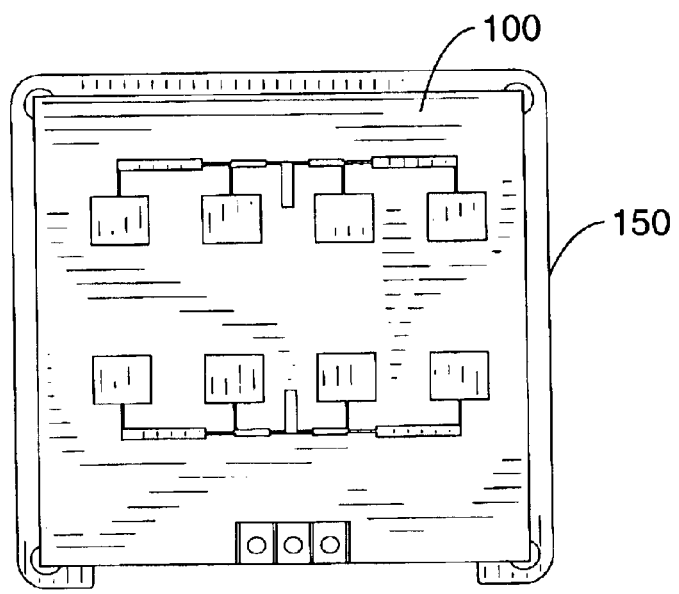
FIG. 15 is a top plan view of the assembly of FIG. 12.

Lastly, referring to FIG. 12 through FIG. 15, the assembled transceiver is shown mounted in a metal housing 150. The bonded construct of oscillator/mixer card 50 and antenna card 100 are hermetically sealed into housing 150. A tuning rod 152 can be seen that is used for adjusting the frequency of the transceiver. Tuning rod 152 is typically an alumina rod sixty-two mils in diameter and 138 mil in length with a copper holder, and rotates in housing 150. This allows the axial position of tuning rod 152 to be adjusted in relation to tuning stub 66 (FIG. 2). Accordingly, frequency tuning is accomplished by direct perturbation of tuning stub 66. Also shown in FIG. 12 are threaded flanges 154 used for mounting the unit.

Note that a transceiver according to the foregoing design has a low Q oscillator that does not require a dielectric resonator to stabilize its oscillation, although one could optionally be used if desired. In addition, the transceiver design does not require a buffer between the oscillator and the mixer. Furthermore, by scaling the design parameters described herein and changing the size of the patch antennas, the transceiver can operate at different frequencies, such as in the range from 16 GHz to 90 GHz. A modulator could also be optionally included in the transceiver so that the transceiver could be used for short-range communications.

As can be seen, a microwave transceiver assembly according to the invention is simple, inexpensive, lightweight and compact, thus making it suitable for commercial production and applications, and for automatic production. Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A high frequency microwave transceiver for use in a motion detector, comprising:

(a) a multilayer microwave circuit board;

(b) said multilayer microwave circuit board comprising an oscillator/mixer card, an antenna card, and a ground plane layer between said oscillator/mixer card and said antenna card;

(c) said multilayer microwave circuit board comprising microstrip circuitry adapted for operation at a frequency within the range from approximately 16 GHz to approximately 90 GHz;

(d) said oscillator/mixer card comprising an oscillator circuit:

(e) said oscillator circuit comprising a surface mounted transistor chip wired bonded in said oscillator circuit;

(f) wherein said oscillator circuit does not include a dielectric resonator;

(g) said oscillator/mixer card comprising a mixer circuit;

(h) said mixer circuit comprising a surface mounted diode chip wire bonded in said mixer circuit;

(i) said antenna card comprising a transmit antenna and a receive antenna;

(j) each antenna having a respective microstrip that substantially overlies an associated microstrip on the oscillator/mixer card;

(k) said ground plane layer having, for each antenna, a respective slot to provide coupling between the antenna microstrip and the associated microstrip on the oscillator/mixer card.

2. A microwave transceiver as recited in claim 1, wherein said transistor chip is selected from the group of devices consisting essentially of an FET, HBT, PHEMT and HEMT.

3. A microwave transceiver as recited in claim 1, wherein said diode chip comprises a Schottky chip.

4. A microwave transceiver as recited in claim 1, wherein said diode chip comprises a Schottky chip and wherein said transistor chip is selected from the group of devices consisting essentially of an FET, HBT, PHEMT and HEMT.

5. A microwave transceiver as recited in claim 1:
wherein an output signal from the oscillator circuit is coupled to an input of a power divider;
wherein a portion of the oscillator signal is coupled to the transmit antenna through a first output of the power divider which is coupled to the transmit antenna;
wherein a portion of the oscillator signal is coupled to the first input of the mixer circuit through a second output of the power divider;
wherein the mixer circuit has a second input coupled to the receive antenna; and
wherein the mixer circuit combines the oscillator signal and a received reflected target signal to produce a Doppler signal.

6. A microwave transceiver as recited in claim 1:
further comprising a second diode chip; and
wherein said mixer circuit comprises a balanced mixer.

7. A microwave transceiver as recited in claim 6, wherein said balanced mixer comprises a pair of Schottky chips.

8. A microwave transceiver as recited in claim 1, wherein said oscillator circuit comprises a low Q oscillator.

9. A high frequency microwave transceiver for use in a motion detector, comprising:

(a) a multilayer microwave circuit board;

(b) said multilayer microwave circuit board comprising an oscillator/mixer card, an antenna card, and a ground plane layer between said oscillator/mixer card and said antenna card;

(c) said multilayer microwave circuit board comprising microstrip circuitry adapted for operation at a frequency within the range from approximately 16 GHz to approximately 90 GHz;

(d) said oscillator/mixer card comprising a low Q oscillator circuit;

(e) said oscillator circuit comprising a surface mounted transistor chip wired bonded in said oscillator circuit;

(f) said oscillator/mixer card comprising a mixer circuit;

(g) said mixer circuit comprising a surface mounted diode chip wire bonded in said mixer circuit;

(h) said antenna card comprising a transmit antenna and a receive antenna;

(i) each antenna having a respective microstrip that substantially overlies an associated microstrip on the oscillator/mixer card;

(j) said ground plane layer having, for each antenna, a respective slot to provide coupling between the antenna microstrip and the associated microstrip on the oscillator/mixer card.

10. A microwave transceiver as recited in claim 9, wherein said transistor chip is selected from the group of devices consisting essentially of an FET, HBT, PHEMT and HEMT.

11. A microwave transceiver as recited in claim 9, wherein said diode chip comprises a Schottky chip.

12. A microwave transceiver as recited in claim 9, wherein said diode chip comprises a Schottky chip and wherein said transistor chip is selected from the group of devices consisting essentially of an FET, HBT, PHEMT and HEMT.

13. A microwave transceiver as recited in claim 9:
wherein an output signal from the oscillator circuit is coupled to an input of a power divider;
wherein a portion of the oscillator signal is coupled to the transmit antenna through a first output of the power divider which is coupled to the transmit antenna;
wherein a portion of the oscillator signal is coupled to the first input of the mixer circuit through a second output of the power divider;
wherein the mixer circuit has a second input coupled to the receive antenna; and
wherein the mixer circuit combines the oscillator signal and a received reflected target signal to produce a Doppler signal.

14. A microwave transceiver as recited in claim 9:
further comprising a second diode chip; and
wherein said mixer circuit comprises a balanced mixer.

15. A microwave transceiver as recited in claim 14, wherein said balanced mixer comprises a pair of Schottky chips.

16. A microwave transceiver as recited in claim 9, wherein said oscillator circuit does not include a dielectric resonator.

17. A high frequency microwave transceiver for use in a motion detector, comprising:

(a) a multilayer microwave circuit board;

(b) said multilayer microwave circuit board comprising an oscillator/mixer card, an antenna card, and a ground plane layer between said oscillator/mixer card and said antenna card;

(c) said multilayer microwave circuit board comprising microstrip circuitry adapted for operation at a frequency within the range from approximately 16 GHz to approximately 90 GHz;

(d) said oscillator/mixer card comprising a low Q oscillator circuit;

(e) said oscillator circuit comprising a surface mounted transistor chip wired bonded in said oscillator circuit;

(f) wherein said oscillator circuit does not include a dielectric resonator:

(g) said oscillator/mixer card comprising a mixer circuit;

(h) said mixer circuit comprising a surface mounted diode chip wire bonded in said mixer circuit;

(i) said antenna card comprising a transmit antenna and a receive antenna;

(j) each antenna having a respective microstrip that substantially overlies an associated microstrip on the oscillator/mixer card;

(k) said ground plane layer having, for each antenna, a respective slot to provide coupling between the antenna microstrip and the associated microstrip on the oscillator/mixer card.

18. A microwave transceiver as recited in claim 17, wherein said transistor chip is selected from the group of devices consisting essentially of an FET, HBT, PHEMT and HEMT.

19. A microwave transceiver as recited in claim 17, wherein said diode chip comprises a Schottky chip.

20. A microwave transceiver as recited in claim 17, wherein said diode chip comprises a Schoftky chip and wherein said transistor chip is selected from the group of devices consisting essentially of an FET, HBT, PHEMT and HEMT.

21. A microwave transceiver as recited in claim 17:
wherein an output signal from the oscillator circuit is coupled to an input of a power divider;
wherein a portion of the oscillator signal is coupled to the transmit antenna through a first output of the power divider which is coupled to the transmit antenna;
wherein a portion of the oscillator signal is coupled to the first input of the mixer circuit through a second output of the power divider;
wherein the mixer circuit has a second input coupled to the receive antenna; and
wherein the mixer circuit combines the oscillator signal and a received reflected target signal to produce a Doppler signal.

22. A microwave transceiver as recited in claim 17:
further comprising a second diode chip; and
wherein said mixer circuit comprises a balanced mixer.

23. A microwave transceiver as recited in claim 22, wherein said balanced mixer comprises a pair of Schottky chips.

24. A high frequency microwave transceiver for use in a motion detector, comprising:
(a) a multilayer microwave circuit board;
(b) said multilayer microwave circuit board comprising an oscillator/mixer card, an antenna card, and a ground plane layer between said oscillator/mixer card and said antenna card;
(c) said multilayer microwave circuit board comprising microstrip circuitry adapted for operation at a frequency within the range from approximately 16 GHz to approximately 90 GHz;
(d) said microwave circuit board comprising means for generating a microwave signal;
(e) said microwave circuit board comprising means for combining said microwave signal with a reflected target signal and generating a Doppler shifted signal;
(f) said antenna card comprising a transmit antenna and a receive antenna;
(g) each antenna having a respective microstrip that substantially overlies an associated microstrip on the oscillator/mixer card;
(h) said ground plane layer having, for each antenna, a respective slot to provide coupling between the antenna microstrip and the associated microstrip on the oscillator/mixer card.

25. A microwave transceiver as recited in claim 24:
wherein said means for generating a microwave signal comprises a low Q oscillator circuit having a transistor chip wire bonded in said oscillator circuit; and
wherein said means for combining said microwave signal with a reflected target signal and generating a Doppler shifted signal comprises a mixer circuit having a diode chip wired bonded in said mixer circuit.

26. A microwave transceiver as recited in claim 25, wherein said transistor chip is selected from the group of devices consisting essentially of an FET, HBT, PHEMT and HEMT.

27. A microwave transceiver as recited in claim 25, wherein said diode chip comprises a Schottky chip.

28. A microwave transceiver as recited in claim 25, wherein said diode chip comprises a Schottky chip and wherein said transistor chip is selected from the group of devices consisting essentially of an FET, HBT, PHEMT and HEMT.

29. A microwave transceiver as recited in claim 25:
wherein an output signal from the oscillator circuit is coupled to an input of a power divider;
wherein a portion of the oscillator signal is coupled to the transmit antenna through a first output of the power divider which is coupled to the transmit antenna;
wherein a portion of the oscillator signal is coupled to the first input of the mixer circuit through a second output of the power divider;
wherein the mixer circuit has a second input coupled to the receive antenna; and
wherein the mixer circuit combines the oscillator signal and a received reflected target signal to produce a Doppler signal.

30. A microwave transceiver as recited in claim 25:
further comprising a second diode chip; and
wherein said mixer circuit comprises a balanced mixer.

31. A microwave transceiver as recited in claim 30, wherein said balanced mixer comprises a pair of Schoftky chips.

32. A microwave transceiver as recited in claim 24, wherein said means for generating a microwave signal does not include a dielectric resonator.

33. A high frequency microwave transceiver for use in a motion detector, comprising:
(a) a multilayer microwave circuit board;
(b) said multilayer microwave circuit board comprising a flexible oscillator/mixer card, an antenna card, and a ground plane layer between said oscillator/mixer card and said antenna card;
(c) said multilayer microwave circuit board comprising microstrip circuitry adapted for operation at a frequency within the range from approximately 16 GHz to approximately 90 GHz;
(d) said oscillator/mixer card comprising a low Q oscillator circuit;
(e) said oscillator circuit comprising a surface mounted transistor chip wired bonded in said oscillator circuit;
(f) wherein said oscillator circuit does not include a dielectric resonator;
(g) said oscillator/mixer card comprising a mixer circuit;
(h) said mixer circuit comprising a surface mounted diode chip wire bonded in said mixer circuit;
(i) said antenna card comprising a transmit antenna and a receive antenna;
(j) each antenna having a respective microstrip that substantially overlies an associated microstrip on the oscillator/mixer card;
(k) said ground plane layer having, for each antenna, a respective slot to provide coupling between the antenna microstrip and the associated microstrip on the oscillator/mixer card.

34. A microwave transceiver as recited in claim 33, wherein said transistor chip is selected from the group of devices consisting essentially of an FET, HBT, PHEMT and HEMT.

35. A microwave transceiver as recited in claim 33, wherein said diode chip comprises a Schottky chip.

36. A microwave transceiver as recited in claim 33, wherein said diode chip comprises a Schottky chip and wherein said transistor chip is selected from the group of devices consisting essentially of an FET, HBT, PHEMT and HEMT.

37. A microwave transceiver as recited in claim 33:

wherein an output signal from the oscillator circuit is coupled to an input of a power divider;

wherein a portion of the oscillator signal is coupled to the transmit antenna through a first output of the power divider which is coupled to the transmit antenna;

wherein a portion of the oscillator signal is coupled to the first input of the mixer circuit through a second output of the power divider;

wherein the mixer circuit has a second input coupled to the receive antenna; and wherein the mixer circuit combines the oscillator signal and a received reflected target signal to produce a Doppler signal.

* * * * *